(12) United States Patent
Iguchi (10) Patent No.: US 8,035,096 B2
(45) Date of Patent: Oct. 11, 2011

(54) SWITCHING DEVICE, REWRITABLE LOGIC INTEGRATED CIRCUIT, AND MEMORY DEVICE

(75) Inventor: Noriyuki Iguchi, Minato-ku (JP)

(73) Assignee: NEC Corporation, Tokyo (JP)

( * ) Notice: Subject to any disclaimer, the term of this patent is extended or adjusted under 35 U.S.C. 154(b) by 212 days.

(21) Appl. No.: 12/278,611

(22) PCT Filed: Feb. 6, 2007

(86) PCT No.: PCT/JP2007/051960
§ 371 (c)(1),
(2), (4) Date: Aug. 7, 2008

(87) PCT Pub. No.: WO2007/091532
PCT Pub. Date: Aug. 16, 2007

(65) Prior Publication Data
US 2009/0034318 A1  Feb. 5, 2009

(30) Foreign Application Priority Data
Feb. 9, 2006  (JP) .................................. 2006-032394

(51) Int. Cl.
*H01L 45/00* (2006.01)
(52) U.S. Cl. 257/4; 257/3; 257/5; 257/43; 257/E45.003; 365/148
(58) Field of Classification Search .................. 257/1–5, 257/E45.001, E45.002, E45.003, 43; 365/148
See application file for complete search history.

(56) References Cited

U.S. PATENT DOCUMENTS

| 2003/0053350 | A1 | 3/2003 | Krieger et al. |
| 2005/0242337 | A1* | 11/2005 | Roehr et al. ................. 257/2 |
| 2005/0286211 | A1 | 12/2005 | Pinnow et al. |
| 2007/0007579 | A1* | 1/2007 | Scheuerlein et al. ........ 257/315 |
| 2007/0285148 | A1* | 12/2007 | Sakamoto et al. ............ 327/365 |

FOREIGN PATENT DOCUMENTS

| EP | 1501124 A1 | 1/2005 |
| JP | 06-028841 A | 2/1994 |
| JP | 2000-512058 A | 9/2000 |
| JP | 2001-525606 A | 12/2001 |
| JP | 2002-536840 A | 10/2002 |
| JP | 2003-092387 A | 3/2003 |
| WO | 03/028124 A1 | 4/2003 |
| WO | 03/094227 A1 | 11/2003 |
| WO | 2005/117026 A1 | 12/2005 |

OTHER PUBLICATIONS

Ssenyange et al., Redox-Driven Conductance Switching via Filament Formation and Dissolution in Carbon/Molecule/TiO2/Ag Molecular Electronic Junctions, Langmuir 2006, 22, 10689-10696.*

(Continued)

*Primary Examiner* — Anh Phung
*Assistant Examiner* — Michael Lulis
(74) *Attorney, Agent, or Firm* — Sughrue Mion, PLLC (57) ABSTRACT

A switching device according to the present invention includes ion conductive layer 23 containing titanium oxide, first electrode 21 provided in contact with ion conductive layer 23, and second electrode 22 provided in contact with ion conductive layer 23 and which can supply metal ions to ion conductive layer 23.

6 Claims, 4 Drawing Sheets

OTHER PUBLICATIONS

T. Sakamoto et al, "Nanometer-scale switches using copper sulfide", Applied Physics Letters, pp. 3032-3034, May 5, 2003, vol. 82, No. 18.

T. Sakamoto et al., "A Nonvolatile Programmable Solid Electrolyte Nanometer Switch", IEEE Internatioanl Solid-State Circuits Conference, 2004, pp. 290-291.

S. Kaeriyama et al., A Nonvolatile Programmable Solid-Electrolyte Nanometer Switch, IEEE Journal of Solid-State Circuits, Jan. 2005, pp. 168-176, vol. 40, No. 1.

H. Namatsu et al., "Three-dimensional siloxane resist for the formation of nanopatterns with minimum linewidth fluctuations", J. Vac. Sci. Technol. B 16(1), Jan./Feb. 1998, pp. 69-76.

* cited by examiner

SWITCHING DEVICE, REWRITABLE LOGIC INTEGRATED CIRCUIT, AND MEMORY DEVICE

CROSS REFERENCE TO RELATED APPLICATION

This application is a National Stage of International Application No. PCT/JP2007/051960, filed Feb. 6, 2007, claiming priority based on Japanese Patent Application No. 2006-032394, filed Feb. 9, 2006, the contents of all of which are incorporated herein by reference in their entirety.

TECHNICAL FIELD

The present invention relates to a switching device utilizing electrochemical reaction, a rewritable logic integrated circuit having the switching device, and a memory device.

BACKGROUND ART

A large number of integrated circuits are currently used in electronic apparatuses. Most of the integrated circuits that are used in the electronic apparatuses are application specific integrated circuits (ASICs). The application specific integrated circuit is a dedicated circuit designed for a specific electronic apparatus. The circuit configuration of the application specific integrated circuit, including the arrangement of logic cells (unit logic circuits for AND circuits, OR circuits, or the like) and connections among the logic cells, cannot be changed after manufacturing.

In recent years, competition for development of electronic apparatuses has been intensifying, and much effort has been made to miniaturize the electronic apparatuses. In these circumstances, much attention has been paid to programmable logic ICs (rewritable logic integrated circuits) which, even after manufacturing, allow specific functions from among many functions on one chip to be selected by changing the circuit configuration with electronic signals. In the programmable logic IC, a plurality of logic cells are connected together via switches. Typical examples of the programmable logic IC include an FPGA (Field-Programmable Gate Array) and a DRP (Dynamically Reconfigurable Processor).

In spite of much attention being paid to the programmable logic IC, the number of examples in which the programmable logic IC is mounted in the electronic apparatus has been limited. The reason is as follows. In the conventional programmable logic IC, switches connecting logic cells together have a large size and thus a high ON-resistance. Thus, a configuration having a small number of logic cells each including a large number of transistors has been adopted in order to minimize the number of switches installed. This reduces the degree of freedom of the combination of the logic cells, limiting the functions of the programmable logic IC. That is, the large size and high on resistance of the switch limit the functions of the programmable logic IC. The mounting of the programmable logic IC in the electronic apparatus is thus limited.

Thus, the size and ON-resistance of the switch, connecting the logic cells together, need to be reduced in order to provide the programmable logic IC with various functions to promote the mounting of the programmable logic IC in the electronic apparatus and the like. As a switch that meets this demand, a switching device has been proposed which utilizes metal ion migration and electrochemical reaction in an ion conductor (a solid through which ions can migrate freely) (see, for example, WO 2003/094227). The switching device disclosed in WO 2003/094227 has a smaller size and a lower ON-resistance than semiconductor switches (MOSFETs) often used in the conventional programmable logic ICs.

Figure 7:
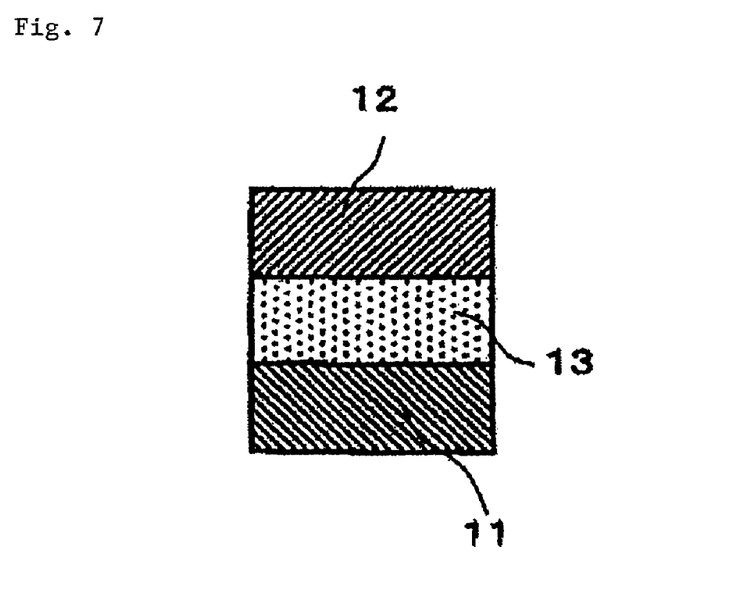
FIG. 7 is a schematic sectional view showing an example of the configuration of a conventional switching device.

FIG. 7 is a schematic sectional view showing the configuration of the switching device disclosed in WO 2003/094227. The switching device has first electrode 11, and second electrode 12 laminated on first electrode 11 via ion conductive layer 13 (referred to as a "solid electrolyte" in Patent Document 1). In this case, ion conductive layer 13 serves as a medium through which metal ions are conducted.

Now, the operation of the switching device shown in FIG. 7 will be described. Second electrode 12 is grounded, and a negative voltage is applied to first electrode 11. Then, metal in second electrode 12 is dissolved into ion conductive layer 13 as metal ions. The metal ions in ion conductive layer 13 are precipitated on a surface of first electrode 11 as metal. The precipitated metal forms metal dendrite connecting first electrode 11 and second electrode 12. The metal dendrite is a metal precipitate resulting from precipitation of the metal ions contained in ion conductive layer 13. The metal dendrite electrically connects first electrode 11 and second electrode 12 together to turn on the switch.

On the other hand, with the switch in the on state, second electrode 12 is grounded, a positive voltage is applied to first electrode 11. Then, the metal dendrite is dissolved into ion conductive layer 13, and a part of the metal dendrite is severed. This electrically disconnects first electrode 11 from second electrode 12 to turn off the switch. Electrical characteristics change before the electric connection is completely cut. For example, the electric resistance between first electrode 11 and second electrode 12 increases or inter-electrode capacitance changes before the electric connection is finally cut. Furthermore, a desirable material for first electrode 11 is a material which does not feed metal ions into the ion conductive layer when the voltage is applied to first electrode 11. Additionally, the negative voltage may be applied to first electrode 11 again in order to change the off state to the on state.

JOURNAL OF SOLID STATE CIRCUITS, Vol. 40, No. 1, 2005, pp. 168 to 176 proposes that such a switching device as shown in FIG. 7 be used as a wiring switch for the programmable device. Compared to conventional switches, this switching device reduces the switch area to $\frac{1}{30}$ and the switch resistance to $\frac{1}{50}$. Moreover, the switching device can be formed into a wiring layer. This is expected to reduce the chip area and to improve possible wiring delays. Furthermore, the size of the logic cells in the programmable logic IC can be reduced, allowing a drastic increase in circuit utilization efficiency. As a result, the chip area is reduced to $\frac{1}{10}$, and power efficiency is tripled. The large chip size and low power efficiency of the conventional programmable logic IC limits the range of applications thereof. However, programmable logic ICs using such a switching device as shown in FIG. 7 can cover a wider application range.

WO 2003/094227 discloses $Cu/Cu_2S$, $Ag/Ag_2S$, and the like as examples of a combination of an electrode material and an ion conductive layer. Any of the material combinations involves the application of a voltage (switching voltage) of about 0.05 to 0.30 [V] to first electrode 11 (FIG. 7) in order to change the switching device from the on state to the off state or from the off state to the on state. On the other hand, for logic signals used in the programmable logic IC as signals, a voltage indicating one of two types of information, that is, an operating voltage for the logic IC, is Vdd [V]. A voltage indicating the other type of information is 0.0 [V]. A Vdd [V] that is currently often used in silicon integrated circuits is about 1.0 to 2.0 [V].

The switching device disclosed in WO 2003/094227 has a switching voltage of at most 0.30 [V]. Consequently, if the Vdd of the logic signal is 1.0 [V], the switching voltage is lower than Vdd. Thus, every time a logic signal with the voltage Vdd [V] is input to the switching device, a voltage of 1.0 [V] is applied to the first electrode. The logic signal may thus change the state of the switch. In this case, a fatal problem may occur; the switch may not function. Therefore, a higher switching voltage needs to be set to stabilize the switching device.

Furthermore, a time equal to or longer than the product life (generally 10 years) of the programmable logic IC is required to hold the state of the switching device (the time required to maintain non-volatility). Heat energy at room temperature is generally 26.0 [meV]. Thus, when the switching voltage is closer to 26.0 [mV], thermal noise may be generated and is likely to cause the switching state to change voluntarily. Therefore, the switching voltage also needs to be increased in order to allow the state of the switching device to be maintained for a longer time.

DISCLOSURE OF THE INVENTION

An object of the present invention is to solve the problems of the related art. Specifically, an object of the present invention is to provide a switching device for which a switching voltage is set higher than that for the related art, a rewritable logic integrated circuit using the switching device, and a memory device.

A switching device according to the present invention includes a first electrode and a second electrode laminated via at least one ion conductive layer. Metal ions are fed from the second electrode to the ion conductive layer and precipitated in the ion conductive layer as metal to electrically connect the first and second electrodes together. The precipitated metal is dissolved into the ion conductive layer to electrically disconnect the first and second electrodes from each other. Alternatively, metal ions are fed from an ion supply layer provided between the second electrode and the ion conductive layer, to the ion conductive layer and precipitated in the ion conductive layer as metal to electrically connect the first and second electrodes together. The precipitated metal is dissolved into the ion conductive layer to electrically disconnect the first and second electrodes from each other. The ion conductive layer contains titanium oxide.

The titanium oxide contained in the ion conductive layer desirably has a stoichiometric composition of oxide and titanium in which the ratio of oxide to titanium is 2:1. Furthermore, desirably, a material for the second electrode is copper, and a material for the first electrode avoids supplying metal ions to the ion conductive layer. Furthermore, desirably, the switching device further includes a circuit that limits current flowing between the first and second electrodes when a voltage is applied to between the first and second electrodes.

A rewritable logic integrated circuit can be configured by using the switching device according to the present invention as a switch that switches on and off a connection between logic cells.

A memory device can be configured by using the switching device according to the present invention and a transistor device that detects whether the switching device is in an on state or an off state. In this case, the first electrode of the switching device is connected to a drain of the transistor device. The second electrode of the switching device is connected to a first bit line. A source of the transistor device is connected to a second bit line different from the first bit line. A gate of the transistor device is connected to a word line.

The above-described and other objects, features, and advantages of the present invention will be apparent from the following description below taken with reference to the accompanying drawings that show an example of the present invention.

BEST MODE FOR CARRYING OUT THE INVENTION

Figure 1:
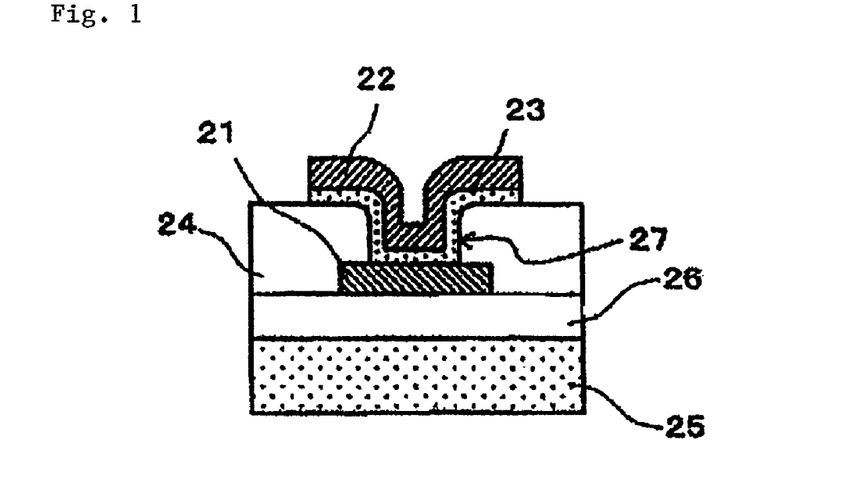
FIG. 1 is a schematic sectional view showing an example of an exemplary embodiment of a switching device according to the present invention.

An example of an exemplary embodiment of a switching device according to the present invention will be described. FIG. 1 is a schematic sectional view showing the basic structure of the switching device in the present example. As shown in FIG. 1, the switching device in the present example has silicon substrate 25 having a surface covered with silicon oxide film 26. First electrode 21, ion conductive layer 23, and second electrode 22 are laminated on silicon oxide film 26. In other words, first electrode 21 and second electrode 22 are laminated across ion conductive layer 23. Here, only one ion conductive layer 23 is illustrated. However, at least two ion conductive layers 23 may be laminated, with first electrode 21 and second electrode 22 provided outside laminated ion conductive layer 23.

Ion conductive layer 23 is formed of a titanium oxide film having a 15.0 [nm] thickness. First electrode 21 is formed of a platinum film having a 100.0 [nm] thickness. Second electrode 22 is formed of a copper film having a 100.0 [nm] thickness. Moreover, first electrode 21 is covered with a silicon oxide film (insulating layer 24) in which opening 27 is formed, and a part of first electrode 21 is in contact with ion conductive layer 23 in opening 27 in insulating layer 24. That is, the switching device in the present example, a switch portion in which the metal is actually precipitated is formed in opening 27 in insulating layer 24. Thus, the junction area between first electrode 21 and ion conductive layer 23 depends on the bottom surface area of opening 27. That is, with the pattern of opening 27 determined, the junction area is determined by the bottom area of opening 27 even though the pattern of first electrode 21, second electrode 22, and ion conductive layer 23 is larger than the pattern of opening 27. Consequently, when a plurality of switching devices are formed in a substrate, the switching characteristics of the devices can be made uniform by accurately forming opening 27 in each of the devices. Thus, the pattern of second electrode 22, first electrode 21, and ion conductive layer 23 need not be formed as accurately as the pattern of opening 27.

Furthermore, as shown in FIG. 1, second electrode 22 and first electrode 21 are separated from each other by insulating layer 24 except for the switch portion. Thus, possible leakage current from the switching device can be inhibited while the switching device is off.

Now, the reason for the selection of copper as a material for second electrode 22 and titanium oxide as a material for ion conductive layer 23 will be described based on the results of experiments.

First, a phenomenon that may occur when the switching state changes will be described taking the conventional switching device shown in FIG. 7, by way of example. When the switching device changes from an off state to an on state, three reactions occur simultaneously. The three reactions are (1) migration of metal ions (in this case, copper ions) in ion conductive layer 13, (2) precipitation reaction of the metal ions in first electrode 11, and (3) dissolution reaction of the metal in second electrode 12. The inventors attempted to set an applied voltage required to change the switching device from the off state to the on state, that is, the switching voltage, to any value by controlling the migration speed of the metal ions, the precipitation speed of the metal, and the dissolution speed of the metal.

Table 1 shows a diffusion coefficient and the switching voltage for combinations of materials for the ion conductive layer and the metal ions. In the table, the combinations are classified by alphabets A to H. The diffusion coefficient is proportional to the ion conductivity, and the ion conductivity increases consistently with the diffusion coefficient. In Table 1, the switching voltages for the combinations other than those D and E were measured using switching devices configured as shown in FIG. 8 and produced by the inventors.

TABLE 1

| | Ion conductive layer | Metal ions | Diffusion coefficient ($cm^2/s$) | Switching voltage (V) |
|---|---|---|---|---|
| A | $Cu_2S$ | Cu | $10^{-6}$-$10^{-8}$ | About 0.2 |
| B | AgI | Ag | No data | About 0.1 |
| C | $Ag_2S$ | Ag | About $10^{-3}$ | About 0.15 |
| D | AgGeSe | Ag | No data | About 0.2 |
| E | AgAsS | Ag | No data | About 0.2 |
| F | $SiO_2$ | Cu | Less than $10^{-22}$ | 1-4 |
| G | $TiO_2$ | Cu | Less than $10^{-22}$ | 1-4 |
| H | $TiO_2$ | Ti | No data | No switching |

As shown in Table 1, in the combinations other than those F and G which use an oxide as the ion conductive layer, the switching voltage is about 0.2 [V], which is much lower than the logic voltage, 1.0 [V]. The results for each of the combinations will be described below in detail.

Each of the combinations A to E uses a material composed of a combination of a chalcogen element (S, Se, Ge, or Te) and a metal element (Ag or Cu) as the ion conductive layer. Each of these compounds is a halide that is a kind of chalcogenide. Many silver halides and copper halides ($Cu_2S$, $Ag_2S$, AgI, and the like) have high ion conductivities and are sometimes called "super ion conductors". A high ion conductivity that is significantly characteristic of materials such as super ion conductors is due to a structural defect based on the crystal structure of these compounds. In these compounds, a large number of vacant lattices corresponding to missing metal or chalcogen elements are present in the crystal and form a site through which metal ions are conducted.

On the other hand, each of the combinations F to H uses an oxide as the ion conductive layer. Ion conduction in the oxide is classified into two types, the type in which the metal ions are conducted through the vacant lattices as in the case of the halide and the type in which the metal ions are conducted between the lattices. The vacant lattices can be generated by introduction of impurity ions. The ion conduction of the type in which metal ions are conducted between the lattices generally involves a very low ion conductivity.

The inventors have noted silicon oxide ($SiO_2$) and titanium oxide ($TiO_2$) as oxides for the ion conductive layer. These oxides are used as a material for conventional LSI (Large Scale Integration) and have the advantage of offering high process resistance and reliability and allowing the switching device according to the present invention to be easily introduced into the LSI.

When the metal ions were copper, the combinations F and G in Table 1 exhibited a switching voltage of at least 1.0 [V] and provided the desired switching voltage. In the combination H that uses titanium ions as a conduction species, no switching was observed. Moreover, when switching devices were produced using the combination F, a dielectric breakdown phenomenon was observed in some of the switching devices. Thus, among the combinations shown in Table 1, the combination G is the best. Thus, in the present example, titanium oxide is used for ion conductive layer 23, shown in FIG. 1. Copper is used for second electrode 22.

Here, not experiment was made using the combination of silver and titanium oxide. However, silver is expected to produce similar effects because silver ions have a diffusion coefficient similar to that of copper ions in titanium oxide. A switching voltage similar to that provided by the combination G is expected to be obtained from any combination of metal ions exhibiting a diffusion coefficient similar to that of copper ions in titanium oxide and the ion conductive layer. Moreover, the switching voltage depends on the diffusion state of the copper ions in the titanium oxide. Thus, even the ion conductive layer partly containing titanium oxide is expected to provide a switching voltage similar to that obtained from the combination G.

Now, a method of manufacturing the switching device shown in FIG. 1 will be described.

Silicon oxide film 26 of film thickness 300.0 [nm] is formed on a surface of silicon substrate 25. Subsequently, first electrode 21 made up of platinum is formed by a liftoff technique as is the case with the related art. Specifically, resist is spin-coated on silicon oxide film 26. Then, first electrode 21 is patterned on the resist by a photolithography technique. Subsequently, a platinum film having a thickness of 100.0 [nm] is formed by a vacuum deposition method. Then, when the resist is removed, the platinum on the resist is lifted off. The remaining part will be first electrode 21.

Subsequently, HSQ (hydrogen silsesquioxane) mainly composed of silicon oxide is used to form insulating layer 24 as follows. HSQ of film thickness 100.0 [nm] is spin-coated, and opening 27 is patterned on first electrode 21 by an electron beam exposure method. Thus, first electrode 21 is partly exposed via opening 27. The use of the HSQ enables patterning by electron beam exposure, eliminating the need for the step of transferring a resist pattern to a lower layer film. The patterning technique using the HSQ is disclosed in, for example, the JOURNAL OF VACUUM SCIENCE TECHNOLOGY B, Vol. 16, No. 1, pp. 69 to 76 (1998). Thus, a detailed description of this technique is omitted.

The HSQ is known as an insulating film having a low dielectric constant (a specific inductive capacity of about 2 to 3) and is used as an interlayer insulating film for LSI. The low dielectric constant is preferred for the material for LSI because the low dielectric constant reduces electrostatic coupling between wiring layers and thus decreases wiring delays. The structure in the present example enables a reduction in electrostatic coupling between first electrode 21 and second electrode 22. This enables inhibition of signal delays in each of the electrodes.

Subsequently, second electrode 22 made up of copper and ion conductive layer 23 made up of titanium oxide are formed as follows. Resist is spin-coated on insulating layer 24, and the resist is patterned by the lithography technique. The patterning not only exposes opening 27 in the resist but also forms an opening larger than the pattern of opening 27. After the patterning, the exposed surface of first electrode 21 is cleaned by oxygen plasma to remove organic substances such as resist residues. Titanium oxide is deposited to a film thickness of 15.0 [nm] by a laser ablation method. At this time, the stoichiometric composition of the titanium oxide, that is, the ratio of oxide to titanium, is set as close to 2:1 as possible. Specifically, a sufficient amount of oxygen is supplied during the laser ablation.

The results of experiments for determining conditions for formation of titanium oxide will be described. The inventors formed titanium oxides under partial oxygen pressures of 0.0 [Pa], 1.0 [Pa], 2.0 [Pa], and 5.0 [Pa], respectively.

Figure 2:
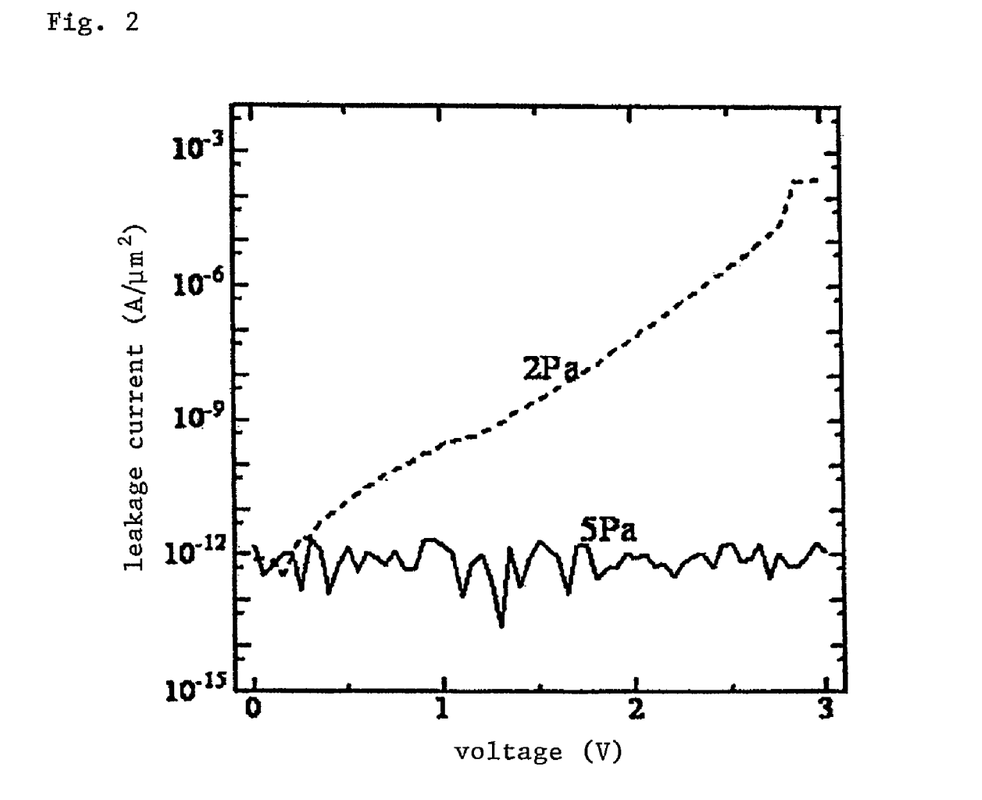
FIG. 2 is a diagram showing leakage current characteristics of titanium oxide.

FIG. 2 is a graph showing a leakage current in the case of titanium oxides formed at partial oxygen pressures of 2.0 [Pa] and 5.0 [Pa], respectively. As shown in the graph in FIG. 2, although titanium oxide is an insulator, for the titanium oxide formed under the partial oxygen pressure of 2.0 [Pa], a leakage current of at least 1.0 [μA] was observed at 2.5 [V]. The large leakage current of 1.0 [μA] is expected to result from an oxygen defect caused by low partial oxygen pressure during formation. On the other hand, for the titanium oxide formed under the partial oxygen pressure of 5.0 [Pa], the leakage current is reduced to about 1.0 [pA]. The leakage current in the order of picoamperes [pA] results from a tunnel effect and indicates that the titanium oxide that is formed functions as an insulating film. Under the partial oxygen pressure of 5.0 [Pa], the composition ratio of oxygen to titanium was successfully set to 2:1. That is, a stoichiometric composition of the titanium oxide corresponding to the ratio of 2:1 was achieved. However, composition analysis shows that the composition ratio includes an error of ±0.1. Thus, the stoichiometric composition of the titanium oxide corresponding to the 2:1 ratio of oxygen to titanium is preferable for inhibiting a possible leakage current while the switching device is off.

Titanium oxide is deposited under the formation conditions determined as described above. Copper is then deposited to a film thickness of 100.0 [nm] by a vacuum deposition method. Subsequently, when the resist is removed, the titanium oxide and copper on the resist are removed together with the resist by means of liftoff. Ion conductive layer 23 and second electrode 22 are thus formed.

The above-described laser ablation and vacuum deposition are preferably performed in the same vacuum chamber. This avoids exposing the interface between the titanium oxide and copper to the atmosphere to allow the interface to be kept clean. The yield of the switching device has been determined to be increased by forming titanium oxide and then depositing copper without exposing the surface of the titanium oxide to the atmosphere. This is expected to be because metal ions and dust such as organic substances which are contained in the atmosphere are prevented from adhering to the titanium oxide to inhibit possible inappropriate insulation caused by the dust.

Although not described in the present example, the use of barrier metal for preventing the electrode material from diffusing through the insulation layer is common technical knowledge. When the switching device shown in FIG. 1 is incorporated into an integrated circuit, barrier metal is formed between first electrode 21 and insulating layer 24 and between second electrode 22 and insulating layer 24.

Moreover, in the present example, platinum is used as a material for first electrode 21. However, the material for first electrode 21 is not limited to platinum but any electrode material may be used which avoids eluting metal ions into ion conductive layer 23. For example, tungsten, tantalum, or titanium may be used.

Figure 3:
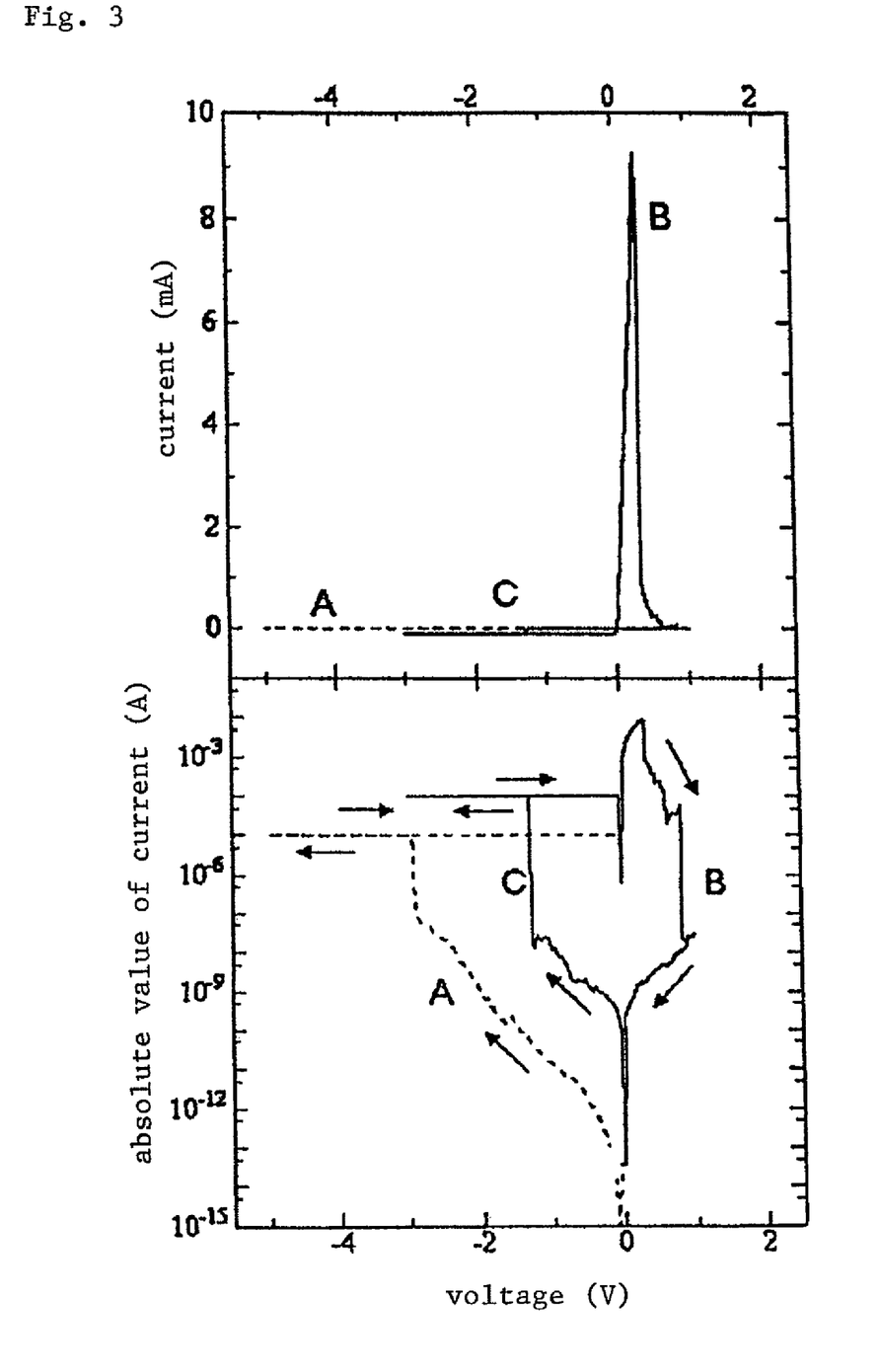
FIG. 3 is a diagram showing switching characteristics of the switching device according to the present invention.

Now, the operation of the switching device shown in FIG. 1 will be described. FIG. 3 is a graph showing the results of measurements for checking switching characteristics. In the measurements, a measurement apparatus was used to limit the absolute values of current to 10.0 [μA]. As shown in FIG. 3, as the value of a negative voltage applied to first electrode 21 shown in FIG. 1 was gradually increased from 0.0 [V] toward a minus side, the current value reached a limit value of 10.0 [μA] when the voltage was close to −3.0 [V] (dashed line A in FIG. 3). The switching device then changed from the off state (high resistance state) to the on state (low resistance state). The switching device was initially in the off state and then changed to the on state to exhibit a resistance value of 3.0 [kΩ] as shown by the dashed line A in FIG. 3. Then, when the voltage applied to first electrode 21 returned to 0.0 [V], the limitation of the current was canceled. Subsequently, the applied positive voltage was gradually increased. Then, a current of at least 9.0 [mA] started to flow when the voltage was close to 0.3 [V]. Then, the voltage was further increased, and the current started to decrease rapidly when the voltage reached 0.8 [V]. The switching device changed to the off state (solid line B shown in FIG. 3). Subsequently, even when the voltage was increased to about 1.0 [V], the flowing current increased only up to $10^{-8}$ [A]. The switching device thus remained in the off state.

Then, when the voltage applied to first electrode 21 returned to 0.0 [V], the absolute value of the current was limited to 100.0 [μA]. The voltage applied to first electrode 21 was increased from 0.0 [V] toward the minus side. The current value then reached the limit value of 100.0 [μA] when the voltage was close to −1.2 [V]. The switching device thus changed to the on state (solid line C shown in FIG. 3).

Subsequently, the switching device was successfully alternately changed to the on state and the off state by applying the positive or negative voltage to first electrode 21 as described above. Furthermore, even when the application of the voltage was stopped after the switching device had been brought into either the on or off state, the switching device remained in that state.

Figure 4:
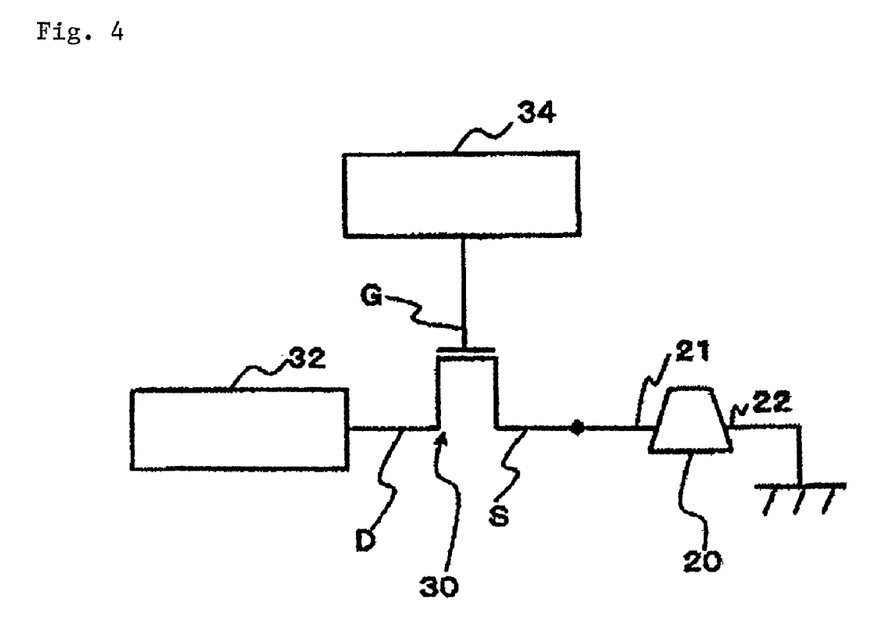
FIG. 4 is a diagram showing an example of the configuration of a current control circuit in the switching device according to the present invention.

In this case, the measuring apparatus was used to control the current flowing through the switching device. An example of a current limiting method used when the switching device is mounted in an integrated circuit in a programmable logic IC and a memory will be described below. FIG. 4 is a diagram showing an example of the configuration of a circuit that limits current. As shown in FIG. 4, MOSFET 30 is connected to switching device 20. Variable voltage source 32 is connected to drain electrode D of MOSFET 30. Control voltage source 34 is connected to gate electrode G of MOSFET 30. Moreover, first electrode 21 of switching device 20 is connected to source electrode S of MOSFET 30. Second electrode 22 of switching device 20 is connected to ground potential. In a saturation region of the Id (drain current)-Vd (drain voltage) characteristic of MOSFET 30, the drain current is maintained substantially constant even with a variation in the drain voltage applied to drain electrode D. This enables limitation of the maximum current flowing into first electrode 21. The magnitude of the drain current can be controlled by the gate voltage applied to gate electrode G. The current flowing through switching device 20 is limited in order to prevent switching device 20 from being broken by Joule heat.

Now, switching characteristics shown in FIG. 3 will be described. When a negative voltage is applied to first electrode 21, shown in FIG. 1, the copper in second electrode 22, shown in FIG. 1, is dissolved into ion conductive layer 23 as copper ions. Then, the copper ions dissolved into the ion conductive layer 23 are precipitated on a surface of first electrode 21 as copper to increase the electric conductivity in ion conductive layer 23. The precipitated copper forms metal dendrite that connects first electrode 21 and second electrode 22 together. The metal dendrite electrically connects first electrode 21 and second electrode 22 together to turn on the switching device.

On the other hand, in the on state, when a positive voltage is applied to first electrode 21, the metal dendrite (copper) is dissolved into ion conductive layer 23, and part of the metal dendrite is severed. This electrically disconnects first electrode 21 from second electrode 22 to bring the switching device into the off state. When the precipitated copper starts to dissolve into the ion conductive layer 23, the electric conductivity in the ion conductive layer 23 decreases. Thus, electrical characteristics change before the electric connection is completely cut. For example, the electric resistance between first electrode 21 and second electrode 22 increases or the inter-electrode capacitance changes. Subsequently, the electric connection is finally cut.

As shown in FIG. 3, the voltage (switching voltage) required for the change differs between the first application of a negative voltage (dashed line A shown in FIG. 3) and the second application of a negative voltage (solid line C shown in FIG. 3). This is expected to be because the first application of the negative voltage diffuses the copper ions in ion conductive layer 23 so that even though the applied voltage is returned to 0.0 [V], the diffused copper ions remain in ion conductive layer 23. Since the switching voltage during the first application of the negative voltage is higher, the limit value of the current flowing through the switching device needs to be reduced taking into account Joule heat generated when the switching device first changes from the off state to the on state.

In the switching device in the present example using oxide (titanium oxide) for the ion conductive layer, the switching voltage required for the change between the on state and the off state is about 1.0 to 2.0 [V] and is higher than that required for a switching device using copper sulfide for the ion conductive layer. Thus, the switching voltage is set higher than a voltage at a thermal noise level that is input to the electrode of the switching device. The switching device can thus be prevented from changing from the set state to the other state.

Furthermore, by limiting the current flowing between electrodes 21 and 22 in the on state, not only can possible destruction of the switching device be prevented, but also power consumption can be reduced.

Figure 5:
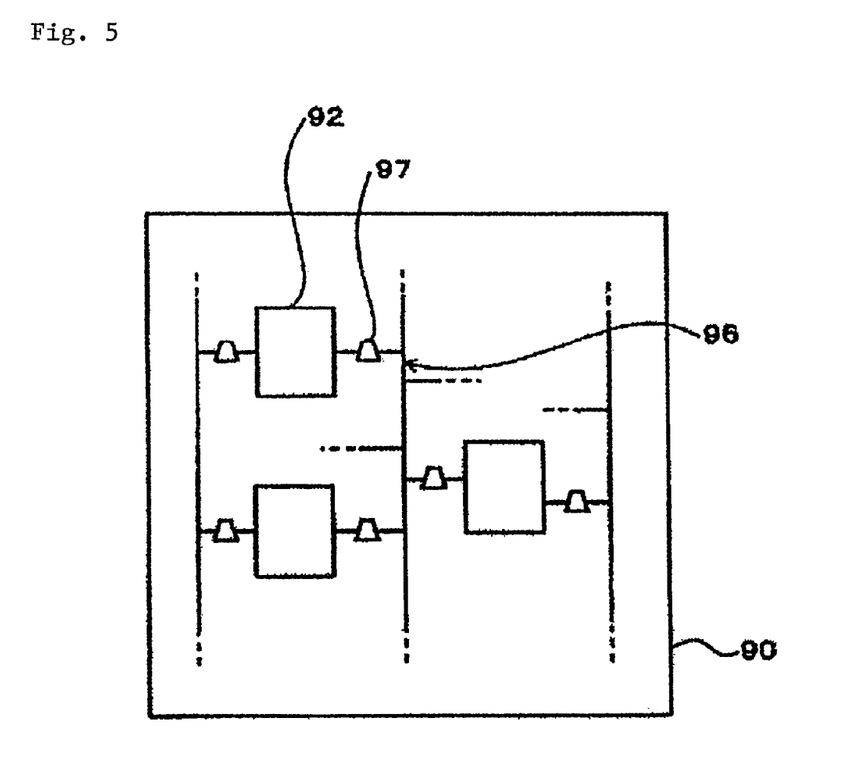
FIG. 5 is a schematic diagram showing an example of the configuration of a programmable logic IC using the switching device according to the present invention.

Now, a programmable logic IC using the switching device in the present example will be described. FIG. 5 is a schematic diagram showing an example of the configuration of the programmable logic IC. As shown in FIG. 5, programmable logic IC 90 is composed of a large number of two-dimensionally arranged logic cells 92, wires that connect logic cells 92 together, and a large number of switches 97 that switch on and off the connection between the wires. Changing the connection state (connection and disconnection) of switches 97 enables setting of the configuration of the wires between logic cells 92, the functions of logic cells 92, and the like. Thus, a logic integrated circuit conforming to specifications can be provided. Each switch 97 uses the switching device in the present example, shown in FIG. 1. Here, the illustration and description of the configuration for limiting current are omitted. However, MOSFET 30, shown in FIG. 4, may be provided in each switch 97.

First electrode 21 of switch 97 is connected to signal line 96 in programmable logic IC 90. Second electrode 22 of switch 97 is connected to logic cell 92. If a user performs a required operation to set switch 97 in the on state, an electric connection is maintained between first electrode 21 and second electrode 22. Upon reaching first electrode 21 via signal line 96, a logical signal is input to logic cell 92 via second electrode 22. On the other hand, if switch 97 is set in the off state, first electrode 21 and second electrode 22 are kept electrically disconnected from each other. In this case, the logic signal reaches first electrode 21 via signal line 96 but is not input to logic cell 92 connected to second electrode 22.

As described above, switch 97 set in the on state by the user functions as a signal line so that logic cell 92 connected to switch 97 set in the on state is kept operative.

By using the switching device in the present example as a switch for the programmable logic IC, the switching voltage is set to a value larger than that of the voltage of the logic signal. The switch can thus be prevented from changing from the set state to the other state.

Here, the switching device in the present example is used to switch on and to switch off the connection to the logic cell. However, the switching device can be used to switch the wires or the functions of the logic cell. The switching device is also applicable to an FPGA or a DRP which allows the circuit configuration to be changed in response to an electronic signal so that one chip can provide many functions.

Figure 6:
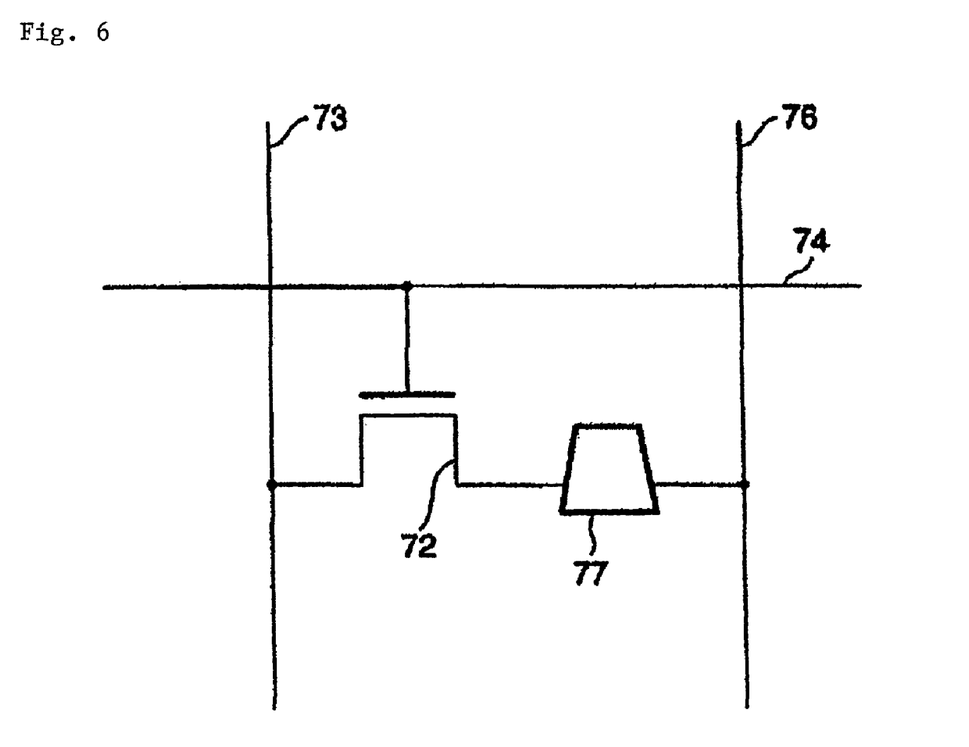
FIG. 6 is a schematic circuit diagram showing an example of the configuration of a memory device using the switching device according to the present invention.

FIG. 6 shows an example of the configuration of a memory device using the switching device in the present example. The memory device has switching device 77 that allows information to be held and transistor device 72 that allows information to be read from switching device 77. Switching device 77 is the switching device in the present example, shown in FIG. 1.

Transistor device 72 has a source electrode connected to bit line 73 and a gate electrode connected to word line 74. Switching device 77 has first electrode 21 connected to a drain electrode of transistor device 72 and second electrode 22 connected to bit line 76. Bit line 76 is connected to ground potential.

Now, a method of writing information to the memory device will be described. Held information is "1" or "0". The on state of the switching device corresponds to "1". The off state of the switching device corresponds to "0". Furthermore, the switching voltage of the switching device is defined as Vt [V]. The operation voltage of transistor device 72 is defined as VR [V]. Here, the absolute value of the switching voltage is Vt [V]=2.0 [V].

To write the information "1" to the memory device, switching voltage-Vt [V] is applied to bit line 73, and voltage VR [V] is applied to word line 74 to turn on transistor device 72. Thus, switching voltage-Vt [V] is applied to first electrode 21 of switching device 77 to turn on switching device 77 to write the information "1" to the memory device.

On the other hand, to write the information "0" to the memory device, switching voltage +Vt [V] is applied to bit line 73, and voltage VR [V] is applied to word line 74 to turn on transistor device 72. Thus, switching voltage +Vt [V] is applied to first electrode 21 of switching device 77 to turn off switching device 77 to write the information "0" to the memory device.

Now, a method of reading information held in the memory device will be described. Voltage VR [V] is applied to word line 74 to turn on transistor device 72 to determine the value of the resistance between bit lines 73 and 76. The resistance value corresponds to the synthetic resistance value of the on resistance of transistor device 72 and switching device 77. If the synthetic resistance value is immeasurably large, switching device 77 can be determined to be in the off state. This indicates that the information held in the memory device is "0". On the other hand, if the synthetic resistance value is smaller than a predetermined value, switching device 77 can be determined to be in the on state. This indicates that the information held in the memory device is "1".

The description of a method of limiting the current flowing through the switching device has been omitted. However, transistor device 72 may perform current control in addition to the above-described operations.

By using the switching device in the present example as a storage device for holding information for the memory device, the set state of the switching device can be prevented from being changed even with the input of the voltage of the thermal noise level. Thus, the stored information is held. Furthermore, the memory device in the present example allows the state of the switching device to be maintained even without power and thus functions as a nonvolatile storage device. Moreover, since the switching voltage is higher than the voltage of the thermal noise level, the period during which information can be stored in the nonvolatile storage device without power is expected to be at least 10 years.

In the switching device in the present example, the ion conductive layer is composed only of titanium oxide. However, films other than the titanium oxide film may be laminated. This configuration is also effective for increasing the switching voltage compared to that in the related art.

In the above description, the supply source for the metal ions is the second electrode. However, the supply source for the metal ions is not limited to the second electrode. For example, if the second electrode is made of a material that does not supply metal ions, an ion supply layer may be provided between the second electrode and the ion conductive layer as the supply source for the metal ions. Here, the ion supply layer means a layer containing a material that can supply the metal ions. An example of the material is chalcogenide containing metal ions (for example, copper sulfide, silver sulfide, or copper selenide). The laminate structure of the switching device including the ion supply layer is the first electrode (Pt), the ion conductive layer ($TiO_2$), the ion supply layer (CuS, AgS, or CuSe), and the second electrode (Pt).

The invention claimed is:

1. A switching device comprising a first electrode and a second electrode laminated via at least one ion conductive layer, copper ions being fed from the second electrode, or an ion supply layer provided between the second electrode and the ion conductive layer, to the ion conductive layer and precipitated in the ion conductive layer as copper metal to electrically connect the first and second electrodes together, the precipitated copper metal being dissolved into the ion conductive layer to electrically disconnect the first and second electrodes from each other, wherein the ion conductive layer contains titanium oxide having a stoichiometric composition of oxide and titanium in which the ratio of oxide to titanium is 2:1, wherein the switching device has a switching voltage from 1V to 4V.

2. The switching device according to claim 1, wherein a material for the second electrode is copper, and a material for the first electrode avoids supplying metal ions to the ion conductive layer.

3. The switching device according to claim 1, further comprising a circuit that limits current flowing between the first and second electrodes when a voltage is applied between the first and second electrodes.

4. A rewritable logic integrated circuit wherein the switching device according to claim 1 is used as a switch that switches on and off a connection between logic cells.

5. A memory device comprising the switching device according to claim 1 and a transistor device that detects whether the switching device is in an on state or an off state.

6. The memory device according to claim 5, wherein the first electrode of the switching device is connected to a drain of the transistor device, the second electrode of the switching device is connected to a bit line, a source of the transistor device is connected to a bit line different from the bit line connected to the second electrode, and a gate of the transistor device is connected to a word line.

* * * * *